(12) United States Patent
Nishikawa et al.

(10) Patent No.: US 9,245,851 B2
(45) Date of Patent: Jan. 26, 2016

(54) SEMICONDUCTOR DEVICE AND METHOD OF MANUFACTURING SEMICONDUCTOR DEVICE

(71) Applicant: FUJI ELECTRIC CO., LTD., Kawasaki-shi (JP)

(72) Inventors: Mutsuo Nishikawa, Matsumoto (JP); Yuko Fujimoto, Shiojiri (JP); Kazuhiro Matsunami, Masumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/328,222

(22) Filed: Jul. 10, 2014

(65) Prior Publication Data
US 2015/0021781 A1 Jan. 22, 2015

(30) Foreign Application Priority Data
Jul. 18, 2013 (JP) .................................. 2013-149124

(51) Int. Cl.
| H01L 23/544 | (2006.01) |
| H01L 21/768 | (2006.01) |
| H01L 23/528 | (2006.01) |

(52) U.S. Cl.
CPC ........ *H01L 23/544* (2013.01); *H01L 21/76895* (2013.01); *H01L 23/528* (2013.01); *H01L 2223/5442* (2013.01); *H01L 2223/54426* (2013.01); *H01L 2223/54453* (2013.01); *H01L 2924/0002* (2013.01)

(58) Field of Classification Search
USPC .......................... 257/797, 283, E23.179, 773
See application file for complete search history.

(56) References Cited

U.S. PATENT DOCUMENTS
2009/0032979 A1   2/2009   Nishikawa et al.

FOREIGN PATENT DOCUMENTS
| JP | 2005-012078 A | 1/2005 |
| JP | 3695106 B2 | 9/2005 |
| JP | 4967904 B2 | 7/2012 |

*Primary Examiner* — Timor Karimy
(74) *Attorney, Agent, or Firm* — Rossi, Kimms & McDowell LLP

(57) ABSTRACT

A semiconductor device has a plurality of first opening portions formed in an interlayer insulating film. The surface is covered with a metal film with a surface having concavities and convexities which scatter reflected light. Size of the first opening portion is of the same level as a contact hole of a component and cannot be recognized by an image recognition apparatus. The metal film can be recognized by the image recognition apparatus. By forming a TiN film serving as a reflection prevention film on an end of the metal film, portions that can easily scatter light and a portion that cannot easily reflect light are adjacent in an alignment marker. A passivation film is formed on the interlayer insulating film and the TiN film. Recessed portions disposed in the metal film are exposed to a second opening portion formed in the passivation film and the TiN film.

15 Claims, 9 Drawing Sheets

SEMICONDUCTOR DEVICE AND METHOD OF MANUFACTURING SEMICONDUCTOR DEVICE

BACKGROUND OF THE INVENTION

A. Field of the Invention

The present invention relates to a semiconductor device and a method of manufacturing a semiconductor device.

B. Description of the Related Art

Conventionally, active components and passive components configuring a circuit are disposed on a substrate of a semiconductor device. The active components are transistors and diodes, for example. The passive components are resistors and capacitors, for example. Furthermore, an alignment marker generally is disposed on the substrate of a semiconductor device, separately from such components. The alignment marker is used as a position recognition pattern that is used for automatically performing positioning between a photomask and a wafer when components are produced in a wafer process. In addition, the alignment marker is used as a pattern for automatically recognizing the position of a chip or the coordinates on a chip in a die-bonding process or a wire-bonding process of a semiconductor chip in an assembly process.

As a semiconductor device in which such an alignment marker is disposed, the following device has been proposed. FIG. 11 is a plan view that illustrates the structure of an alignment marker of a conventional semiconductor device. FIG. 12 is a cross-sectional view that illustrates the cross-sectional structure taken along cutting plane line AA-AA' represented in FIG. 11. FIGS. 11 and 12 are FIGS. 1 and 2 represented in U.S. Pat. No. 4,967,904. By forming a plurality of opening portions 105 in an interlayer insulating film 104 and covering the surface thereof with a metal film 106, the surface of the metal film 106 is formed to be uneven, whereby reflected light is scattered. The size of the opening portion 105 is the size of a level that is the same as that of a contact hole of the component and of a level that is not recognizable for an image recognition apparatus. The size of the metal film 106 is of a level that is recognizable for an image recognition apparatus (for example, see U.S. Pat. No. 4,967,904).

According to U.S. Pat. No. 4,967,904, by actively using light that is scattered by being reflected on the metal film, even when the semiconductor device is tilted or the thickness of a passivation film is uneven, the alignment marker can be recognized with high precision. In addition, since the sizes of the opening portion and the contact hole are small to be unrecognizable for an image recognition apparatus, the alignment marker can be recognized with high precision without using an expensive image recognition apparatus capable of recognizing fine patterns. Accordingly, the cost of the manufacturing process and the product unit price can be easily lowered. In FIGS. 11 and 12, a semiconductor substrate 101, a SiO$_2$ layer 102, a polysilicon film 103, and a passivation film 107 are illustrated.

In recent years, in order to improve the degree of integration or lower the cost, a gate length and a wiring width tend to be micronized in semiconductor devices. As a method of manufacturing a semiconductor device to which a micronizing technology is applied, a method has been proposed in which a reflection prevention film used for preventing light from irregularly reflecting on an aluminum (Al) film at the time of exposing a patterning resist mask of the Al film is formed on the Al film (for example, see U.S. Pat. No. 3,695,106). As another method, a method has been proposed in which a titanium nitride (TiN) film disposed on an alignment mark is removed with the TiN film remaining on a fuse for preventing the reflection of light on the fuse and improving the reading precision of the alignment mark (for example, see Japanese Patent Application Laid-Open (JP-A) No. 2005-012078).

Generally, a TiN film is used as the reflection prevention film and is formed on an Al film that is formed as a metal wiring. In a case where the metal wiring is configured only by the Al film, light is irregularly reflected on the metal wiring at the time of exposing a patterning resist mask of the metal wiring, which is a factor for degrading micronizing the pattern size. Accordingly, in U.S. Pat. No. 3,695,106 and JP-A No. 2005-012078, as an outermost surface layer of the metal film configuring the metal wiring, a TiN film on which it is difficult for light to be reflected is formed, whereby the pattern size is micronized in the exposure process. In addition, the TIN film suppresses the growth of hillocks (fine projections) generated from the Al film when the product is heated or heat-treated in the manufacturing process.

According to U.S. Pat. No. 4,967,904 described above, the recognition precision of the alignment marker is improved by using light that is reflected on the metal film. On the other hand, according to U.S. Pat. No. 3,695,106 and JP-A No. 2005-012078, by arranging the reflection prevention film that prevents light from being reflected on the metal film, for example, the gate length and the wiring width are micronized. Accordingly, in a case where the technology disclosed in U.S. Pat. No. 3,695,106 or JP-A No. 2005-012078 is applied to the technology disclosed in U.S. Pat. No. 4,967,904, the function of the technology disclosed in U.S. Pat. No. 4,967,904 is offset by the function of the technology disclosed in U.S. Pat. No. 3,695,106 or JP-A No. 2005-012078, whereby the advantage of improving the recognition precision of the alignment marker disclosed in U.S. Pat. No. 4,967,904 cannot be acquired (trade-off relation). In other words, in a semiconductor device in which the alignment marker disclosed in U.S. Pat. No. 4,967,904 is disposed, there is a problem in that micronization is difficult to be achieved.

The present invention solves the problems of the conventional technologies described above, and provides a semiconductor device and a method of manufacturing a semiconductor device capable of realizing high position recognition precision and micronization.

SUMMARY OF THE INVENTION

In order to solve the above-described problems, a semiconductor device according to the present invention has the following features in a semiconductor device in which an alignment marker is disposed on a semiconductor substrate.

The alignment marker includes a wiring layer, an interlayer insulating film, a first metal film and a second metal film for position detection, and a passivation film. The wiring layer is disposed on a surface of the semiconductor substrate. The interlayer insulating film is disposed on the surface of the semiconductor substrate so as to cover the wiring layer. A plurality of first opening portions that are disposed in the interlayer insulating film at a depth for reaching the wiring layer are disposed. The first metal film is disposed on a surface of the interlayer insulating film along an inner wall of the first opening portions so as to be brought into contact with the wiring layer and has a shape in which concavities and convexities are continuously formed. The second metal film is disposed on a surface of the first metal film such that recessed portions of the concavities and convexities of the first metal film are exposed. The second metal film is formed by using a material preventing reflection of incidence light incident from the outside. The passivation film is disposed on the surfaces of the interlayer insulating film and the second metal film. The passivation film is formed by using a material allowing the incidence light to be transmitted.

In addition, according to a semiconductor device of this invention, in the above-described invention, the passivation film and the second metal film are disposed on the periphery of the first metal film, and one second opening portion that exposes all the recessed portions of the first metal film is disposed in the second metal film.

In addition, according to a semiconductor device of this invention, in the above-described invention, a plurality of second opening portions exposing the recessed portions of the first metal film are disposed in the second metal film.

In addition, according to a semiconductor device of this invention, in the above-described invention, the concavities and convexities of the first metal film are continuously formed on the entire face of the first metal film.

In addition, according to a semiconductor device of this invention, in the above-described invention, the size of the alignment, marker is larger than the size of one pixel of an image recognition apparatus used for position detection.

In addition, according to a semiconductor device of this invention, in the above-described invention, at least two or more of the alignment markers are disposed on the semiconductor substrate.

A method of manufacturing a semiconductor device according to this invention is provided, which is a method of manufacturing a semiconductor device that forms a component structure on a semiconductor substrate and forms an alignment marker and has the following features. First, a wiring layer that configures the component structure and the alignment marker is selectively formed on a surface of the semiconductor substrate. Next, an interlayer insulating film that configures the component structure and the alignment marker is formed on the surface of the semiconductor substrate so as to cover the wiring layer. Next, a contact hole that configures the component structure at a depth reaching the wiring layer is formed in the interlayer insulating film, and a plurality of first opening portions that configure the alignment marker and have a size that is the same as the contact hole are formed. Next, a first metal film for position detection is formed on surfaces of the interlayer insulating film and the first opening portion. Next, a second metal film that is formed by using a material preventing reflection of incidence light incident from the outside is formed on a surface of the first metal film. Next, a passivation film that configures the component structure and the alignment marker is formed on the surfaces of the interlayer insulating film and the second metal film. Next, a second opening portion that selectively exposes the second metal film is formed by removing the passivation film disposed on the first opening portion. Next, a portion of the second metal film that is exposed to the second opening portion is removed.

In addition, according to a method of manufacturing a semiconductor device of this invention in the above-described invention, in the forming of a second opening potion, the passivation film disposed on an area including all the first opening portions is removed.

According to the above-described invention, since portions that can easily scatter light can be concentrated in the alignment marker, the position recognition precision of the image recognition apparatus for the alignment marker can be improved. In addition, according to the above-described invention, by disposing the second metal film on the first metal film that configures the alignment marker so as to expose the recessed portions of the first metal film, portions reflecting light according to the concavities and convexities of the first metal film can be highlighted to be further brightened. Furthermore, according to the above-described invention, in the structure of the alignment marker, after the component structure of the semiconductor device is formed by applying a micronization technology, the process of exposing the concavities and convexities (the portions to be recognized by the image recognition apparatus) of the first metal film can be performed. Accordingly, there is no adverse effect on the recognition precision of the alignment marker in accordance with the micronization of the semiconductor device, and the alignment marker having high recognition precision can be formed.

According to a semiconductor device and a method of manufacturing a semiconductor device according to the present invention, the position recognition precision can be improved, and micronization can be realized.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereinafter, semiconductor devices and methods of manufacturing a semiconductor device according to preferred embodiments of the present invention will be described in detail with reference to the attached drawings. In description of the following embodiments and the attached drawings, the same reference signs are assigned to the same configuration, and duplicate description thereof will not be presented.

Embodiment 1

Figure 1:
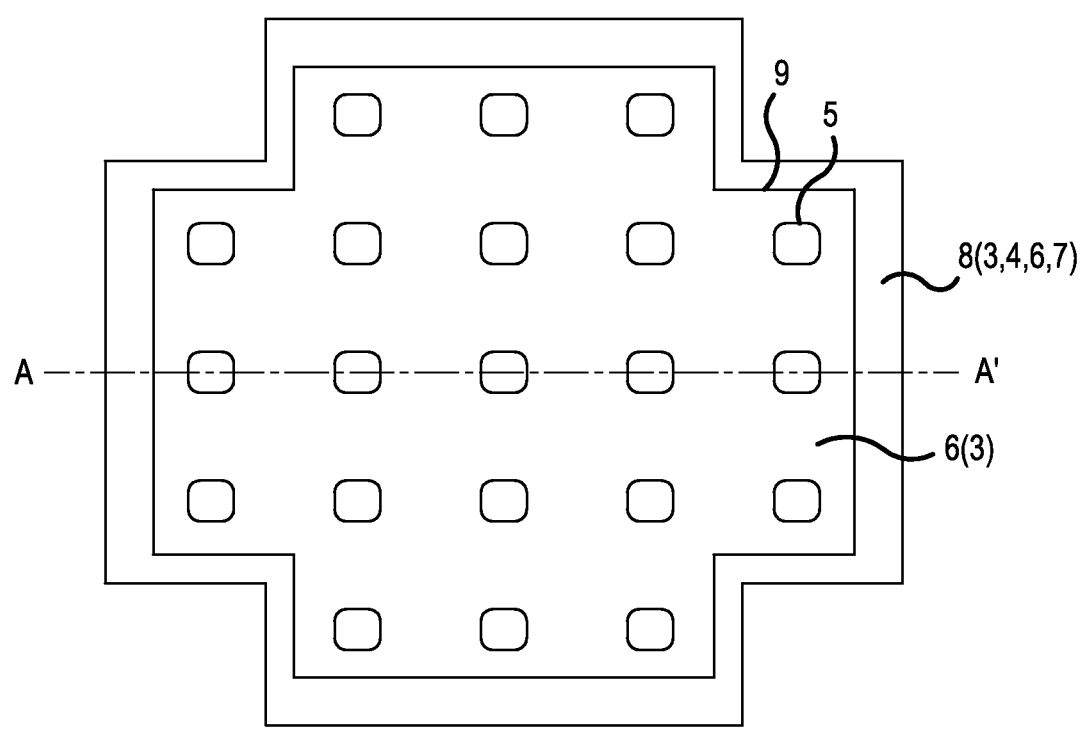
FIG. 1 is a plan view that illustrates the structure of an alignment marker of a semiconductor device according to Embodiment 1.

First, the planar structure of an alignment marker of a semiconductor device according to Embodiment 1 will be described. FIG. 1 is a plan view that illustrates the structure of the alignment marker of the semiconductor device according to Embodiment 1. As illustrated in FIG. 1, the alignment marker of the semiconductor device according to Embodiment 1 is configured by recessed portions 5 that are disposed on the entire face of a metal film (first metal film) 6, for example, in a matrix pattern. On the lower side (substrate side) of the metal film 6, a polysilicon film (wiring layer) 3 having a shape similar to the metal film 6, for example, a planar shape of a cross shape is disposed. The recessed portion 5 is a cavity that is formed by depressing the metal film 6 inside an opening portion formed in the interlayer insulating film 4 disposed between the metal film 6 and the polysilicon film 3.

The size of one recessed portion 5 is smaller than one pixel size of an image recognition apparatus. In other words, the image recognition apparatus cannot recognize each one recessed portion 5. On the other hand, the metal film 6 has a size that can be sufficiently recognized by the image recognition apparatus. More specifically, the minimal resolving power of an image recognition apparatus used in the assembly process, for example, is 8 μm. The diameter of the recessed portion 5 is of a size level that is the same as that of a general contact hole (not illustrated) used in the component and, for example, is about 1.2 μm. In addition, a distance between the recessed portions 5, for example, is 1.2 μm or larger in consideration of the expansion of round etching used for forming opening portions in the interlayer insulating film 4 in the horizontal direction (the direction parallel to the substrate principal face).

Generally, the width of the polysilicon film 3, for example, is about 50 to 200 μm. Accordingly, in the metal film 6 having a shape similar to the polysilicon film 3, for example, about 20 to 100 recessed portions 5 are arranged in one row in the direction of cutting plane line A-A'. On the entire face of the metal film 6, several hundreds to several thousands of recessed portions 5 are arranged. Along the contour of the metal film 6, a titanium nitride (TiN) film (second metal film) 7 surrounding the periphery of the metal film 6 is disposed. On the surface of the TIN film 7, a passivation film 8 is disposed. More specifically, one second opening portion 9 is disposed in the passivation film 8 and the TiN film 7. In other words, one second opening portion 9 is disposed in one alignment marker. In this second opening portion 9, all the recessed portions 5 (hereinafter, referred to as a group of the recessed portions 5) disposed in the metal film 6 are exposed.

Figure 2:
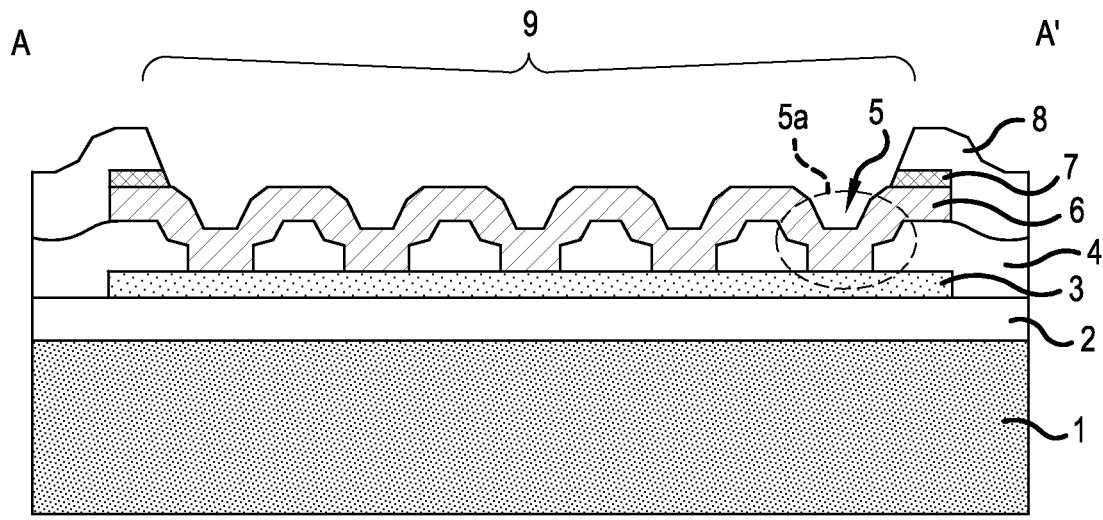
FIG. 2 is a cross-sectional view that illustrates a cross-sectional structure taken along cutting plane line A-A' represented in FIG. 1.

Next, the cross-sectional structure of the alignment marker of the semiconductor device according to Embodiment 1 will be described. FIG. 2 is a cross-sectional view that illustrates a cross-sectional structure taken along cutting plane line A-A' represented in FIG. 1. As illustrated in FIG. 2, the alignment marker of the semiconductor device according to Embodiment 1 is manufactured using a semiconductor substrate 1. On the surface of the semiconductor substrate 1, an oxide film (SiO$_2$) layer 2 is disposed. The polysilicon film 3 is disposed in a part of the surface of the SiO$_2$ layer 2. The polysilicon film 3 may be used as a gate electrode that configures a component structure such as a MOS gate (an insulating gate configured by metal-oxide film-semiconductor) structure disposed in an area of the semiconductor device that is not illustrated in the figure.

On the surfaces of the polysilicon film 3 and the SiO$_2$ layer 2, the interlayer insulating film 4 is disposed. In the interlayer insulating film 4, a plurality of first opening portions 5a are disposed. The first opening portion 5a passes through the interlayer insulating film 4 in the depth direction and reaches the polysilicon film 3. The first opening portion 5a has a cross-sectional shape in which a portion located far from the polysilicon film 3 is open more widely than a portion located close to the polysilicon film 3. A side wall of the first opening portion 5a, which is located far from the polysilicon film 3, near the end portion is formed as a curved face. By disposing the first opening portions 5a each having such a shape in the interlayer insulating film 4, the shape of the metal film 6 disposed on the interlayer insulating film 4 allows light incident from the image recognition apparatus to be easily scattered.

The metal film 6 covers the first opening portions 5a of the interlayer insulating film 4 disposed on the surface of the interlayer insulating film 4. Inside the first opening portion 5a of the interlayer insulating film 4, the metal film 6 forms a concave shape along the inner wall of the first opening portion 5a. In other words, in the metal film 6, the recessed portion 5 is disposed on each first opening portion 5a of the interlayer insulating film 4. A portion of the metal film 6 that is disposed between the recessed portions 5 is located on the interlayer insulating film 4 so as to form a projected portion. Accordingly, the recessed portion 5 and the projected portion are repeatedly arranged in the metal film 6, and accordingly, the metal film 6 has a shape in which concavities and convexities are continuously present. For example, the metal film 6 is formed from aluminum (Al). The metal film 6 is brought into contact with the polysilicon film 3 through the first opening portions 5a. In other words, the first opening portions 5a of the interlayer insulating film 4 serve as contact hole holes.

End portions of the metal film 6 extend on the interlayer insulating film 4. On the periphery of the metal film 6, the passivation film 8 is disposed on the interlayer insulating film 4. The passivation film 8 is formed using a material that allows light to be transmitted through it. End portions of the passivation film 8 extend on the end portions of the metal film 6. On each end portion of the metal film 6, the TiN film 7 is disposed between the passivation film 8 and the metal film 6. In other words, the TiN film 7 is disposed along the contour of the metal film 6. The TiN film 7 serves as a reflection prevention film that prevents light from being irregularly reflected. A side face of the passivation film 8 (the side wall of the second opening portion 9) that is disposed in an end portion on the metal film 6 side may have a cross-sectional shape in which a portion located far from the metal film 6 is open more widely than a portion located close to the metal film 6 or a cross-sectional shape that is perpendicular to the principal face of the semiconductor substrate 1.

In such an alignment marker, when incidence light is incident to the semiconductor device from the image recognition apparatus, the light is reflected on the metal film 6, and the reflected light is scattered by each one of the concavities and convexities in the metal film 6. The concavities and the convexities formed in the metal film 6 are formed on the entire face of the metal film 6. Accordingly, the scattering of the reflected light occurs on the entire face of the metal film 6. In other words, the reflected light is uniformly scattered on the entire face of the metal film 6. While each one of the recessed portions 5 of the metal film 6 is not recognized by the image recognition apparatus, by arranging a plurality of the recessed portions 5 in the metal film 6 to be in a predetermined shape, portions scattering the light are concentrated in the metal film 6, and the area of the portions scattering the light can be increased. By forming the shape formed according to the recessed portion 5 to be larger than the minimum resolving power of the image recognition apparatus, the shape of a portion that emits the scattered light in a concentrated manner is recognized by the image recognition apparatus, and accordingly, the position of the alignment marker can be detected.

In addition, by disposing the TiN film 7 on the periphery of the metal film 6, in the alignment marker, portions (the concavities and convexities of the metal film 6) from which light can be easily scattered and a portion (the TiN film 7) from which light cannot be easily scattered are present to be adjacent to each other. In other words, in the semiconductor device as a product, a portion that reflects light the most and is viewed to be bright and a portion that reflects light the least and is viewed to be dark are present to be adjacent to each other, and, by generating contrast as above, the portion that reflects light and is viewed to be bright is highlighted to be further brightened. Accordingly, the position recognition precision of the alignment marker according to the image recognition apparatus can be further improved. At least two alignment markers are disposed on the semiconductor substrate. Accordingly, a relative position is determined.

Furthermore, as described above, since the size of the contact hole of the component is smaller than the minimal resolving power of the image recognition apparatus, the contact hole of the component is not recognized by the image recognition apparatus. Accordingly, the alignment marker and the contact hole of the component can be clearly discriminated from each other, and the contact hole of the component can be prevented from being incorrectly recognized as the alignment marker by the image recognition apparatus. Therefore, the alignment marker and, for example, a bonding pad of a MOS transistor that configures an integrated circuit (IC) can be discriminated from each other.

Figure 3:
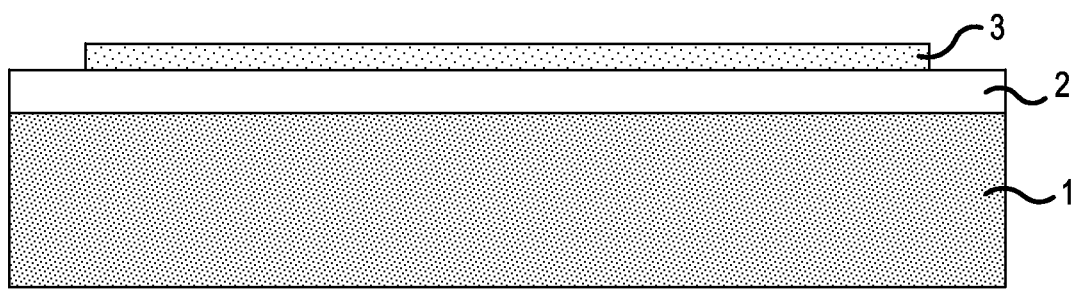
FIG. 3 is a cross-sectional view that illustrates a manufacturing state of the alignment marker of the semiconductor device according to Embodiment 1.
Figure 4:
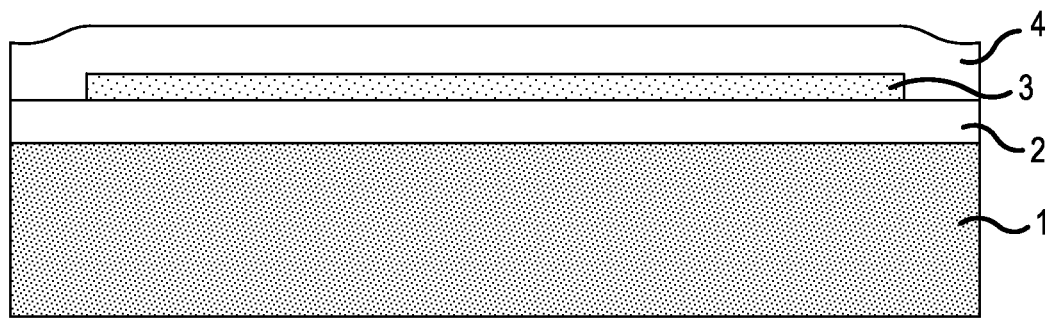
FIG. 4 is a cross-sectional view that illustrates a manufacturing state of the alignment marker of the semiconductor device according to Embodiment 1.

Next, a method of manufacturing an alignment marker of a semiconductor device according to Embodiment 1 will be described. FIGS. 3 to 8 are cross-sectional views that illustrate manufacturing states of the alignment marker of the semiconductor device according to Embodiment 1. First, as illustrated in FIG. 3, the SiO$_2$ layer 2 is formed in the surface layer of the semiconductor substrate 1 that is formed using silicon (Si), for example, through thermal oxidation. After the polysilicon film 3 is deposited on the surface of the SiO$_2$ layer 2, the polysilicon film 3 is formed, for example, to have a planar shape of the cross through patterning and etching. As illustrated in FIG. 4, the interlayer insulating film 4 is deposited on the entire face of the SiO$_2$ layer 2 on which the polysilicon film 3 has been formed.

Figure 5:
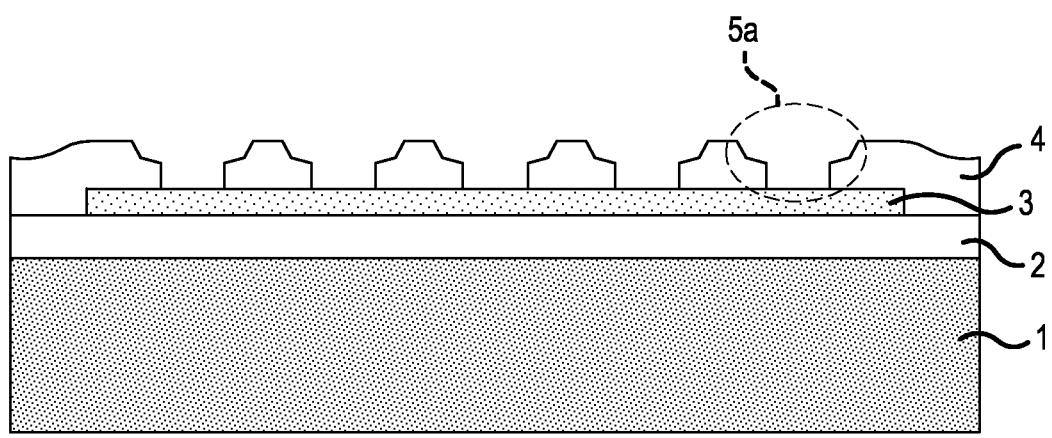
FIG. 5 is a cross-sectional view that illustrates a manufacturing state of the alignment marker of the semiconductor device according to Embodiment 1.

As illustrated in FIG. 5, the interlayer insulating film 4 is selectively removed for a small depth, for which the polysilicon film 3 is not exposed, through isotropic etching called round etching, whereby a plurality of approximately arc-shaped grooves are formed, for example, at equal intervals. Next, portions of the interlayer insulating film 4 that are interposed between the bottom of the grooves and the polysilicon film 3 are removed until arriving at the polysilicon film 3 through isotropic etching called contact etching. In this way, the first opening portions 5a each having a cross-sectional shape in which a portion located far from the semiconductor substrate 1 is open more widely than a portion located close to the semiconductor substrates 1 are formed in the interlayer insulating film 4.

Figure 6:
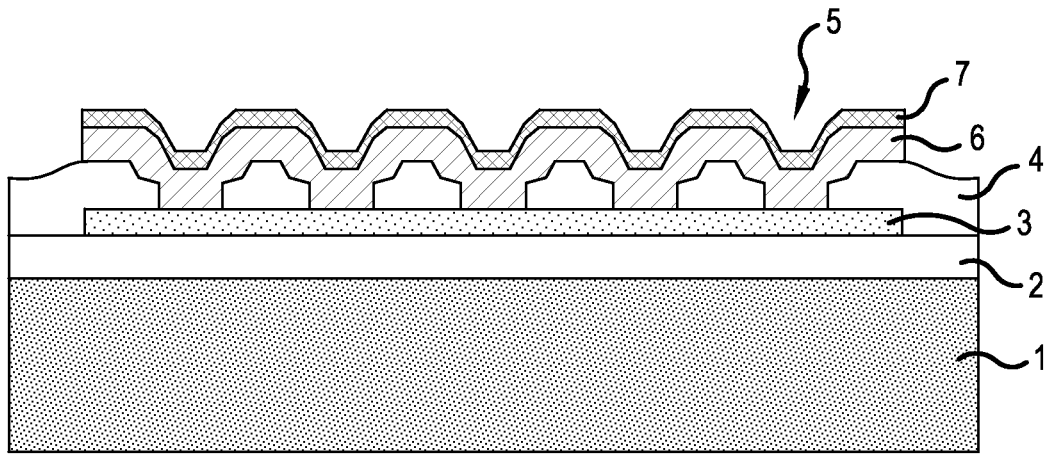
FIG. 6 is a cross-sectional view that illustrates a manufacturing state of the alignment marker of the semiconductor device according to Embodiment 1.
Figure 7:
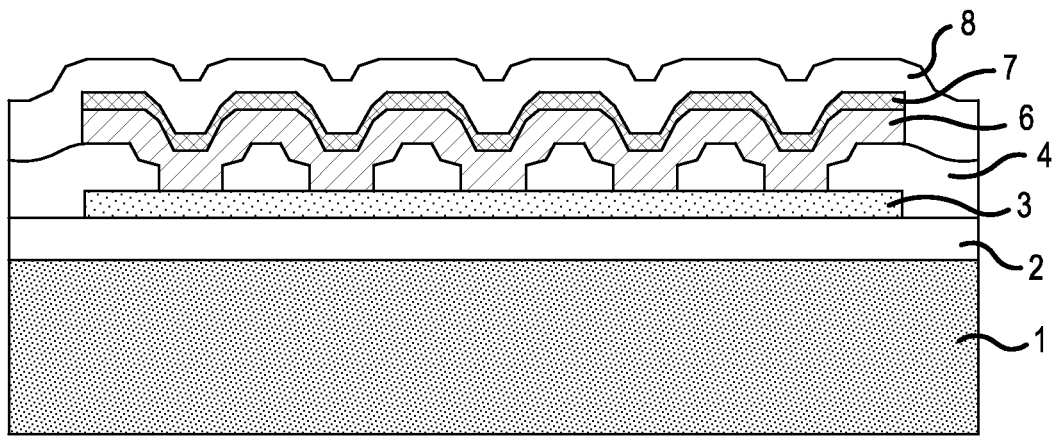
FIG. 7 is a cross-sectional view that illustrates a manufacturing state of the alignment marker of the semiconductor device according to Embodiment 1.

As illustrated in FIG. 6, the metal film 6 is formed on the surface of the interlayer insulating film 4 so as to cover the first opening portions 5a of the interlayer insulating film 4. Since the first opening portions 5a are formed in the interlayer insulating film 4, the recessed portions 5 are formed in portions of the metal film 6 that are disposed on the first opening portions 5a, and a shape is formed in which continuous concavities and convexities are present on the entire face of the metal film 6. Next, the TiN film 7 is formed on the surface of the metal film 6. Next, the metal film 6 and the TiN film 7 are formed through patterning and etching to have the same planar shape as that of the polysilicon film 3. On the periphery of the metal film 6 and the TiN film 7, the interlayer insulating film 4 is exposed. As illustrated in FIG. 7, the passivation film 8 is formed on the entire face of the TiN film 7 and the interlayer insulating film 4.

Figure 8:
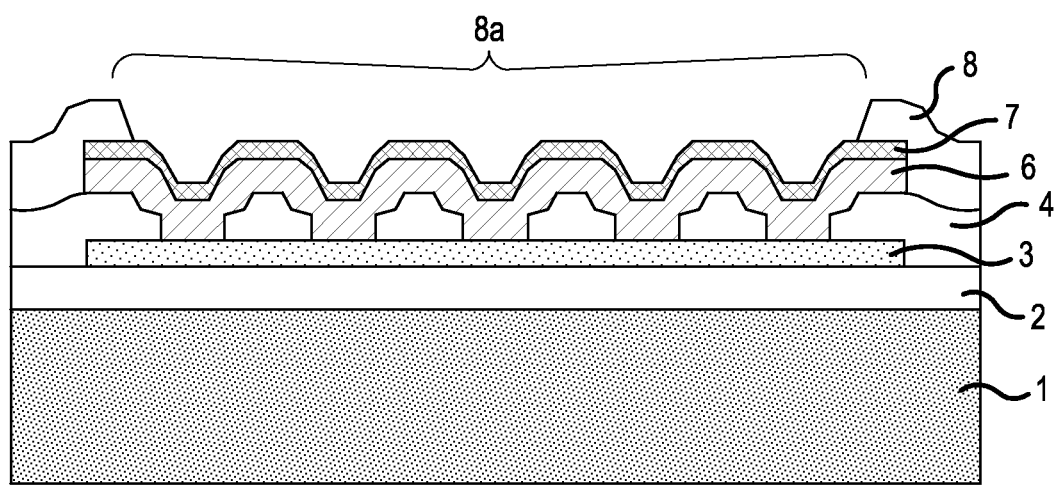
FIG. 8 is a cross-sectional view that illustrates a manufacturing state of the alignment marker of the semiconductor device according to Embodiment 1.

As illustrated in FIG. 8, for example, through dry etching, an opening portion 8a is formed by removing the passivation film 8 of a portion covering a range including a group of the recessed portions 5 of the metal film 6, whereby the TiN film 7 is exposed. For example, through dry etching, the TiN film 7 exposing to the opening portion 8a of the passivation film 8 is removed, whereby the metal film 6 is exposed. In this way, the TiN film 7 is caused to remain so as to surround the periphery of the metal film 6, and the group of the recessed portions 5 of the metal film 6 is exposed to the second opening portions 9 of the passivation film 8 and the TiN film 7. In this way, as illustrated in FIG. 1, the manufacturing process of the alignment marker of the semiconductor device according to Embodiment 1 is completed.

In the above-described method of manufacturing the alignment marker of the semiconductor according to Embodiment 1, as the semiconductor substrate 1, the SiO$_2$ layer 2, the polysilicon film 3, the interlayer insulating film 4, the metal film 6, the TiN film 7, and the passivation film 8, layers formed when, for example, a MOS transistor configuring a general IC is manufactured may be used, or a formation process performed at the time of manufacturing a general IC may be used. More specifically, for example, as the SiO$_2$ layer 2, a LOCOS layer may be used. In addition, as the polysilicon film 3, a polysilicon film used for a gate electrode of a MOS transistor may be used. As the interlayer insulating film 4 and the passivation film 8, those used for a MOS gate structure may be used.

The interlayer insulating film 4 is a SiO$_2$ layer, for example, called an HTO film, a BPSG film, or a TEOS film. The passivation film 8, for example, is a laminated film of a silicon oxide film (SiO$_2$) and a silicon nitride (SiN) film. For the metal film 6 and the TiN film 7, a process that is the same as the formation process of a bonding pad or the like may be used. In addition, the first opening portions 5a may be formed simultaneously at the time of forming a contact hole used for connecting a metal gate electrode to a gate electrode of polysilicon. Accordingly, the structure of the alignment marker of the semiconductor device according to Embodiment 1 is a structure that can be easily integrated using the process for manufacturing an IC. In addition, in forming the alignment marker, a new process is not added, and accordingly, an increase in the cost does not occur.

The process of selectively removing the TiN film 7 of the alignment marker is performed at the last stage of the manufacturing process. Accordingly, by forming the TiN film 7 serving as a reflection prevention film on the entire face of the metal film that configures the component structure of the semiconductor device configuring the IC, for example, even in a case where the gate length or the wiring width is micronized, the TiN film 7 of the alignment marker can be selectively removed at the last stage of the manufacturing process. Thus, the micronization of the semiconductor device is not blocked by the process of removing the TiN film 7 of the alignment marker. In addition, even when the component structure of the semiconductor device is formed by applying a micronization technology, the group of the recessed portions 5 of the metal film 6 is exposed by selectively removing the TiN film 7 of the alignment marker at the last stage of the manufacturing process, and accordingly, there is no adverse effect on the recognition precision of the alignment marker in accordance with to the micronization of the semiconductor device. Therefore, the alignment marker having high recognition precision can be formed.

As described above, according to Embodiment 1, since portions (the concavities and convexities of the metal film) that can easily scatter light can be concentrated in the alignment marker, the position recognition precision of the image recognition apparatus for the alignment marker can be improved. In addition, according to Embodiment 1, by disposing the TiN film serving as a reflection prevention film so as to surround the periphery of the metal film configuring the alignment marker, the portions reflecting light can be highlighted to be further brightened in accordance with the concavities and convexities of the metal film. Furthermore, according to Embodiment 1, in the structure of the alignment marker, after the component structure of the semiconductor device is formed by applying a micronization technology, the process of exposing the concavities and convexities (the portions to be recognized by the image recognition apparatus) of the first metal film can be performed. Accordingly, there is no adverse effect on the recognition precision of the alignment marker in accordance with the micronization of the semiconductor device, and the alignment marker having high recognition precision can be formed. Therefore, both the micronization of the semiconductor device and improvement of the position recognition precision can be achieved. In addition, according to Embodiment 1, in acquiring both the micronization of the semiconductor device and improvement of the position recognition precision, a new process is not added, whereby an increase in the manufacturing cost can be prevented.

Embodiment 2

Figure 9:
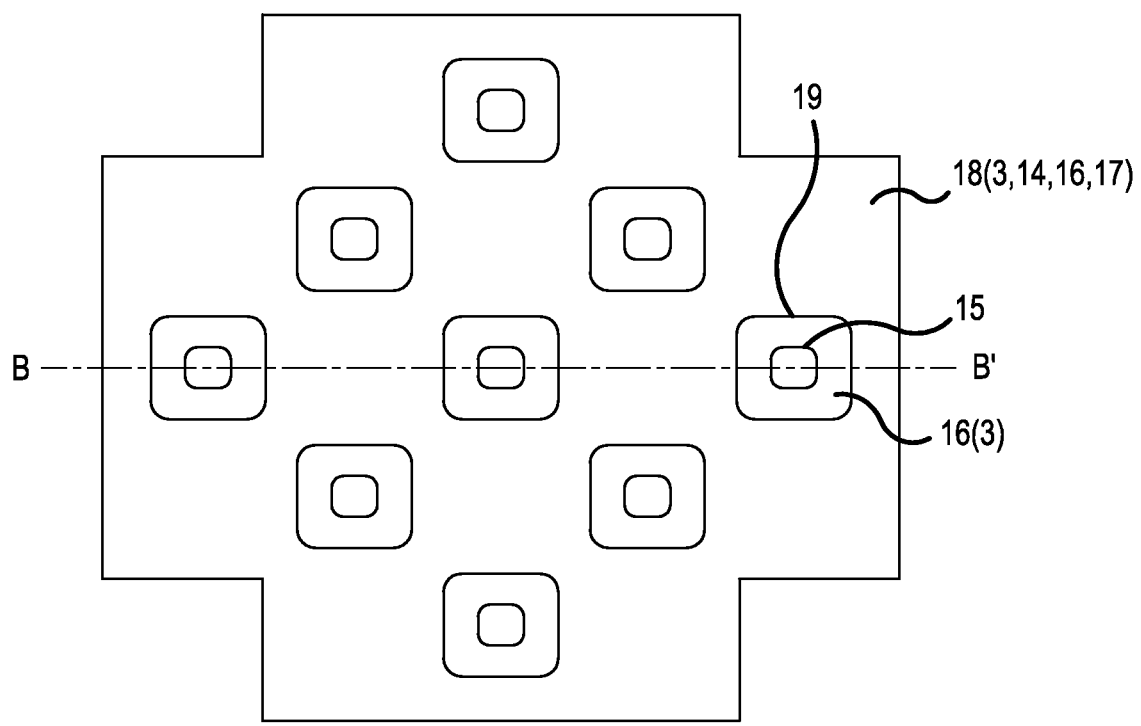
FIG. 9 is a plan view that illustrates the structure of an alignment marker of a semiconductor device according to Embodiment 2.
Figure 10:
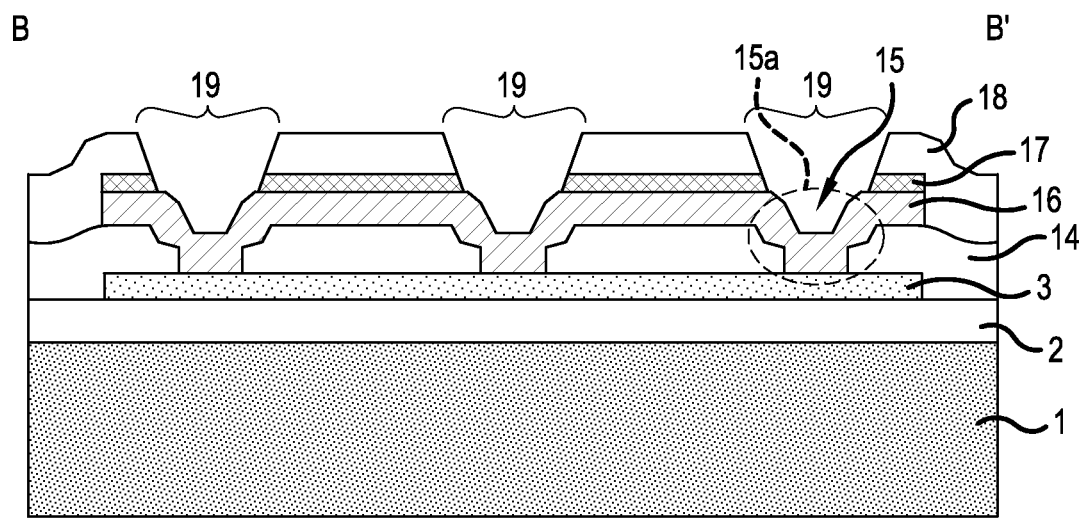
FIG. 10 is a cross-sectional view that illustrates a cross-sectional structure taken along cutting plane line B-B' represented in FIG. 9.
Figure 11:
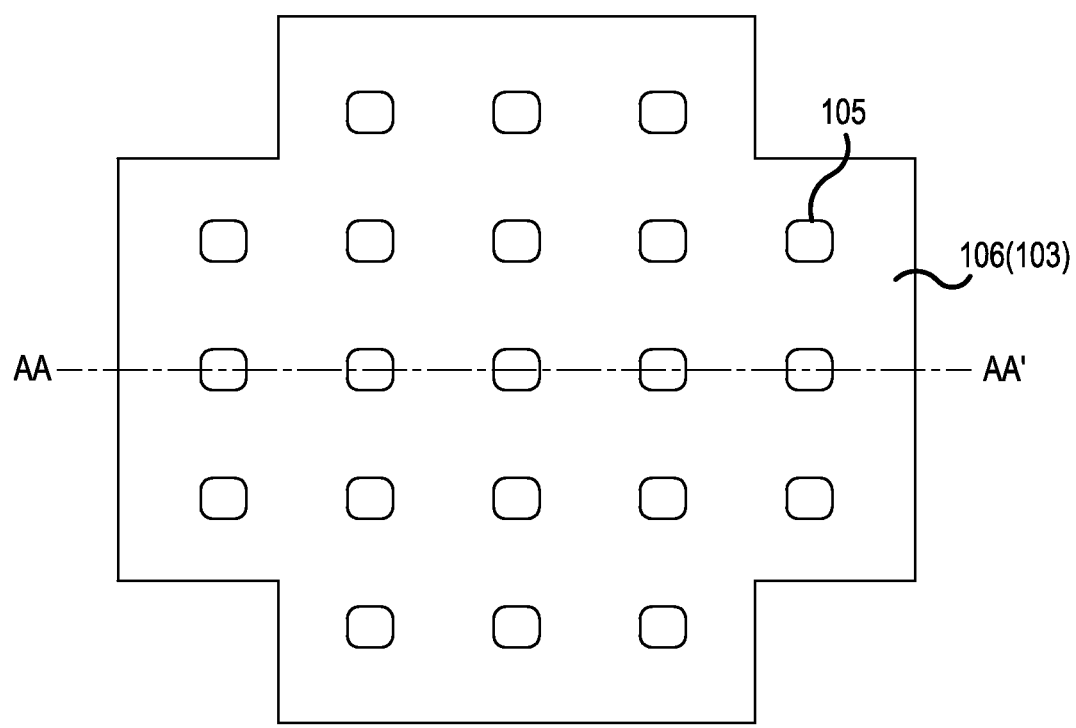
FIG. 11 is a plan view that illustrates the structure of an alignment marker of a conventional semiconductor device.
Figure 12:
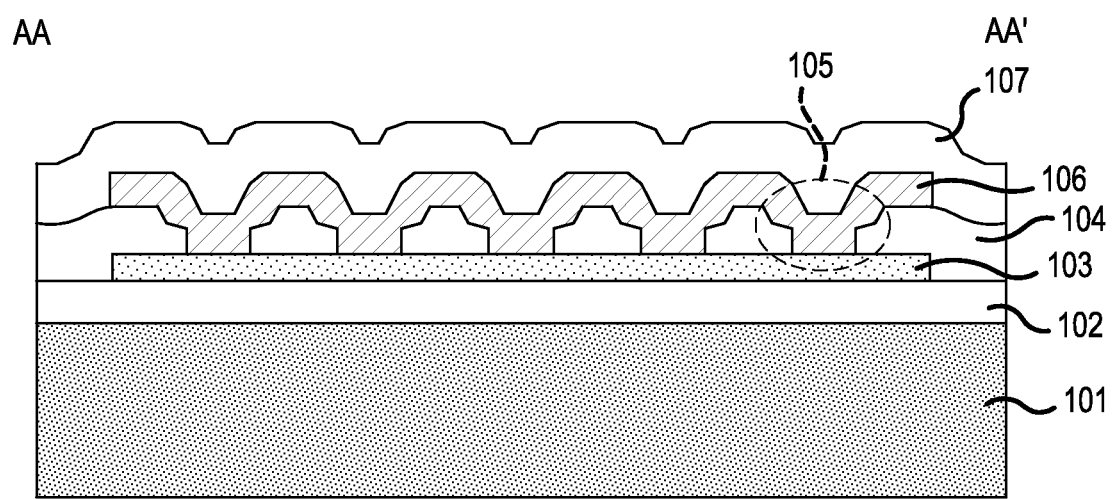
FIG. 12 is a cross-sectional view that illustrates a cross-sectional structure taken along cutting plane line AA-AA' represented in FIG. 11.

Next, the structure of an alignment marker of a semiconductor device according to Embodiment 2 will be described. FIG. 9 is a plan view that illustrates the structure of the alignment marker of the semiconductor device according to Embodiment 2. FIG. 10 is a cross-sectional view that illustrates a cross-sectional structure taken along cutting plane line B-B' represented in FIG. 9. In the alignment marker of the semiconductor device according to Embodiment 2, there is a difference from the alignment marker of the semiconductor device according to Embodiment 1 in that one recessed portion 15 of the metal film 16 is exposed to a second opening portion 19 of the passivation film 18 and the TiN film 17. In other words, in one alignment marker, the second opening portions 19 corresponding to the number of the recessed portions 15 are disposed. In this case, in the method of manufacturing the alignment marker of the semiconductor device according to Embodiment 1, when the passivation film 18 and the TiN film 17 are selectively removed, it may be configured such that the passivation film 18 and the TiN film 17 are removed only in portions disposed on the recessed portions 15 of the metal film 16, and the passivation film 18 and the TiN film 17 are allowed to remain on projected portions formed between the recessed portions 15 of the metal film 16.

In FIGS. 9 and 10, an interlayer insulating film 14 and a first opening portion 15a of the interlayer insulating film are represented.

As described above, according to Embodiment 2, the same advantages as those of Embodiment 1 can be achieved. In addition, according to Embodiment 2, portions (the concavities and convexities of the metal film) that can easily reflect light by scattering the light and a portion (the TiN film) on which light is difficult to reflect are present to be further adjacent to each other. Therefore, the recognition precision of the alignment marker can be further improved.

The present invention is not limited to each embodiment described above, but various changes can be made therein in a range not departing from the concept of the present invention. For example, in each embodiment described above, while the metal film configuring the alignment marker is formed to have the planar shape of a cross, the planar shape is not limited thereto. In addition, in Embodiment 1 described above, although the TiN film is disposed on the end portion of the metal film, the TiN film may be disposed so as to surround the metal film on the outer side of the metal film.

As above, the semiconductor device and the method of manufacturing a semiconductor device according to the present invention are useful for manufacturing a semiconductor device for an in-vehicle use, an industry application, a medical application, and the like and, particularly, are appropriate to assembly processes such as wire bonding and die bonding.

Thus, there are provided a semiconductor device and a method of manufacturing a semiconductor device that have high position recognition precision and are capable of realizing micronization. By forming a plurality of first opening portions in an interlayer insulating film and covering the surface with a metal film, the surface of the metal film is formed in the shape of concavities and convexities, and reflected light is scattered. The size of the first opening portion is of the same level as a contact hole of a component and cannot be recognized by an image recognition apparatus. The size of the metal film is of a level that can be recognized by the image recognition apparatus. By forming a TiN film serving as a reflection prevention film on an end portion of the metal film, portions (concavities and convexities of the metal film) that can easily scatter light and a portion (TiN film) that cannot easily reflect light are present in an alignment marker so as to be adjacent to each other. A passivation film is formed on the interlayer insulating film and the TiN film. All recessed portions disposed in the metal film are exposed to a second opening portion formed in the passivation film and the TiN film.

A semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

ELEMENTS IN THE DRAWINGS

1 Semiconductor substrate
2 $SiO_2$ layer
3 Polysilicon film
4 and 14 Interlayer insulating film
5 and 15 Recessed portion of metal film
5a and 15a First opening portion of interlayer insulating film
6 and 16 Metal film
7 and 17 TiN film 8 and 18 Passivation film
9 and 19 Second opening portion of passivation film and TiN film

What is claimed is:

1. A semiconductor device in which an alignment marker is disposed on a semiconductor substrate, wherein the alignment marker includes:
   a wiring layer that is disposed on a surface of the semiconductor substrate;
   an interlayer insulating film that is disposed on the surface of the semiconductor substrate so as to cover the wiring layer;
   a plurality of first opening portions that are disposed in the interlayer insulating film to a depth which reaches the wiring layer;
   a first metal film for position detection that is disposed on a surface of the interlayer insulating film along an inner wall of the first opening portions so as to be brought into contact with the wiring layer, which has a shape in which concavities and convexities are continuously formed;
   a second metal film that is disposed on a surface of the first metal film such that recessed portions of the concavities and convexities of the first metal film are exposed, which is formed of a material which prevents reflection of incident light; and
   a passivation film that is disposed on the surfaces of the interlayer insulating film and the second metal film, which is formed of a material which allows incident light to be transmitted.

2. The semiconductor device according to claim 1, wherein the passivation film and the second metal film are disposed on the periphery of the first metal film, and a single second opening portion that exposes all the recessed portions of the first metal film is disposed in the second metal film.

3. The semiconductor device according to claim 2, wherein the concavities and convexities of the first metal film are continuously formed on the entire face of the first metal film.

4. The semiconductor device according to claim 2, wherein the size of the alignment marker is larger than the size of one pixel of an image recognition apparatus used for position detection.

5. The semiconductor device according to claim 2, wherein at least two or more of the alignment markers are disposed on the semiconductor substrate.

6. The semiconductor device according to claim 1, wherein a plurality of second opening portions that expose the recessed portions of the first metal film are disposed in the second metal film.

7. The semiconductor device according to claim 6, wherein the concavities and convexities of the first metal film are continuously formed on the entire face of the first metal film.

8. The semiconductor device according to claim 6, wherein the size of the alignment marker is larger than the size of one pixel of an image recognition apparatus used for position detection.

9. The semiconductor device according to claim 6, wherein at least two or more of the alignment markers are disposed on the semiconductor substrate.

10. The semiconductor device according to claim 1, wherein the concavities and convexities of the first metal film are continuously formed on the entire face of the first metal film.

11. The semiconductor device according to claim 10, wherein the size of the alignment marker is larger than the size of one pixel of an image recognition apparatus used for position detection.

12. The semiconductor device according to claim 10, wherein at least two or more of the alignment markers are disposed on the semiconductor substrate.

13. The semiconductor device according to claim 1, wherein the size of the alignment marker is larger than the size of one pixel of an image recognition apparatus used for position detection.

14. The semiconductor device according to claim 13, wherein at least two or more of the alignment markers are disposed on the semiconductor substrate.

15. The semiconductor device according to claim 1, wherein at least two or more of the alignment markers are disposed on the semiconductor substrate.

* * * * *